(12) United States Patent
Sayyah et al.

(10) Patent No.: US 11,002,832 B2
(45) Date of Patent: May 11, 2021

(54) CHIP-SCALE LIDAR WITH A SINGLE 2D MEMS SCANNER

(71) Applicant: GM GLOBAL TECHNOLOGY OPERATIONS LLC, Detroit, MI (US)

(72) Inventors: Keyvan Sayyah, Santa Monica, CA (US); Oleg Efimov, Thousand Oaks, CA (US); Pamela R. Patterson, Los Angeles, CA (US); Raymond Sarkissian, Studio City, CA (US); James H. Schaffner, Chatsworth, CA (US); Biqin Huang, Torrance, CA (US); David Hammon, Simi Valley, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 412 days.

(21) Appl. No.: 16/018,831

(22) Filed: Jun. 26, 2018

(65) Prior Publication Data
US 2019/0018113 A1    Jan. 17, 2019

Related U.S. Application Data

(60) Provisional application No. 62/531,414, filed on Jul. 12, 2017.

(51) Int. Cl.
*G01S 7/48*    (2006.01)
*G01S 7/481*    (2006.01)
(Continued)

(52) U.S. Cl.
CPC .............. *G01S 7/4815* (2013.01); *B81B 7/02* (2013.01); *G01S 7/4816* (2013.01);
(Continued)

(58) Field of Classification Search
USPC ....................................................... 356/4.01
See application file for complete search history.

(56) References Cited

U.S. PATENT DOCUMENTS 4,394,060 A *   7/1983   Verber ............... G02B 6/12004
                                                324/76.36
5,139,879 A     8/1992   Aharoni
(Continued)

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — James R Hulka
(74) *Attorney, Agent, or Firm* — Cantor Colburn LLP

(57) ABSTRACT

A LIDAR system, LIDAR chip and method of manufacturing a LIDAR chip. The LIDAR system includes a photonic chip configured to transmit a transmitted light beam and to receive a reflected light beam, a scanner for directing the transmitted light beam towards a direction in space and receiving the reflected light beam from the selected direction, and a fiber-based optical coupler. The photonic chip and the scanner are placed on a semiconductor integrated platform (SIP). The fiber-based optical coupler is placed on top of the photonic chip to optically couple to the photonic chip for directing the a transmitted light beam from the photonic chip to the scanner and for directing a reflected light beam from the scanner to the photonic chip.

20 Claims, 5 Drawing Sheets

(51) Int. Cl.
*G01S 7/4911* (2020.01)
*G01S 17/58* (2006.01)
*G01S 17/42* (2006.01)
*G01S 17/34* (2020.01)
*G01S 17/86* (2020.01)
*G01S 17/931* (2020.01)
*G01S 7/499* (2006.01)
*G01S 17/02* (2020.01)
*G02B 6/122* (2006.01)
*G02B 6/27* (2006.01)
*G02B 6/42* (2006.01)
*H01L 23/544* (2006.01)
*H01L 31/0232* (2014.01)
*H01L 31/16* (2006.01)
*G01S 17/00* (2020.01)
*G01S 17/32* (2020.01)
*G01S 7/4914* (2020.01)
*G01S 7/491* (2020.01)
*G01S 7/497* (2006.01)
*B81B 7/02* (2006.01)
*G02B 27/30* (2006.01)
*H01S 5/125* (2006.01)
*G01S 7/4913* (2020.01)
*G02B 6/00* (2006.01)

(52) U.S. Cl.
CPC .......... *G01S 7/4817* (2013.01); *G01S 7/4818* (2013.01); *G01S 7/491* (2013.01); *G01S 7/499* (2013.01); *G01S 7/4911* (2013.01); *G01S 7/4913* (2013.01); *G01S 7/4914* (2013.01); *G01S 7/4972* (2013.01); *G01S 17/003* (2013.01); *G01S 17/02* (2013.01); *G01S 17/32* (2013.01); *G01S 17/34* (2020.01); *G01S 17/42* (2013.01); *G01S 17/58* (2013.01); *G01S 17/86* (2020.01); *G01S 17/931* (2020.01); *G02B 6/122* (2013.01); *G02B 6/2766* (2013.01); *G02B 6/4209* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *G02B 2006/0098* (2013.01); *H01L 2223/54426* (2013.01); *H01L 2223/54486* (2013.01)

(56) References Cited

U.S. PATENT DOCUMENTS

| | | | |
|---|---|---|---|
| 5,283,846 A | 2/1994 | Toyonaka | |
| 5,499,132 A | 3/1996 | Tojo | |
| 5,835,199 A * | 11/1998 | Phillips | G01S 7/4802 356/5.03 |
| 5,852,492 A * | 12/1998 | Nimblett | G01S 7/51 356/5.04 |
| 6,122,110 A | 11/2000 | Park | |
| 6,229,947 B1 | 5/2001 | Vawter | |
| 6,480,331 B1 | 11/2002 | Cao | |
| 6,839,170 B2 * | 1/2005 | Li | G02B 6/2746 359/484.04 |
| 6,962,345 B2 | 11/2005 | Inciong | |
| 7,031,574 B2 * | 4/2006 | Huang | G02B 6/2746 385/21 |
| 7,081,996 B2 * | 7/2006 | Wills | G02B 6/272 359/484.03 |
| 7,108,810 B2 | 9/2006 | Nakamura | |
| 7,359,593 B2 | 4/2008 | Little | |
| 7,481,588 B2 | 1/2009 | Monte | |
| 7,596,315 B2 * | 9/2009 | Nakashima | H04J 14/0246 398/34 |
| 8,116,602 B2 | 2/2012 | Little | |
| 8,121,450 B2 | 2/2012 | Webster | |
| 8,193,555 B2 * | 6/2012 | Lin | H01L 27/14621 257/99 |
| 8,878,095 B2 * | 11/2014 | Li | B23K 26/066 219/121.75 |
| 8,908,251 B2 * | 12/2014 | Sayyah | G01S 7/4817 359/254 |
| 9,122,037 B2 | 9/2015 | Shastri | |
| 9,310,471 B2 | 4/2016 | Sayyah | |
| 9,335,480 B1 | 5/2016 | Celo | |
| 9,575,162 B2 | 2/2017 | Owechko | |
| 9,683,928 B2 | 6/2017 | Swanson | |
| 9,720,218 B2 * | 8/2017 | Cui | G02B 21/367 |
| 9,733,544 B2 * | 8/2017 | Sayyah | H01L 31/02161 |
| 9,735,885 B1 * | 8/2017 | Sayyah | H01Q 15/0086 |
| 9,804,264 B2 | 10/2017 | Villeneuve et al. | |
| 9,823,118 B2 * | 11/2017 | Doylend | G01S 7/4813 |
| 10,288,805 B2 * | 5/2019 | Luff | G02B 6/1228 |
| 10,324,261 B2 * | 6/2019 | Leijtens | G02B 6/264 |
| 10,564,263 B2 | 2/2020 | Efimov et al. | |
| 10,591,600 B2 * | 3/2020 | Villeneuve | G01S 17/02 |
| 10,615,568 B2 * | 4/2020 | Sayyah | G02B 1/11 |
| 10,886,437 B2 | 1/2021 | Camras et al. | |
| 2001/0030807 A1 | 10/2001 | Ikari | |
| 2002/0012167 A1 | 1/2002 | Wills | |
| 2003/0077437 A1 * | 4/2003 | Nakamura | B82Y 20/00 428/327 |
| 2003/0155720 A1 * | 8/2003 | Inciong | F16J 15/0825 277/592 |
| 2004/0070827 A1 | 4/2004 | Li | |
| 2005/0018967 A1 | 1/2005 | Huang | |
| 2005/0213979 A1 | 9/2005 | Nakashima | |
| 2006/0002443 A1 | 1/2006 | Farber | |
| 2006/0285797 A1 * | 12/2006 | Little | G02B 6/1228 385/43 |
| 2008/0118208 A1 * | 5/2008 | Monte | G02B 6/25 385/96 |
| 2009/0096545 A1 * | 4/2009 | O'Hara | H01P 7/08 332/129 |
| 2009/0162013 A1 * | 6/2009 | Webster | G02B 6/32 385/39 |
| 2009/0262766 A1 * | 10/2009 | Chen | H03C 7/027 372/26 |
| 2010/0200898 A1 | 8/2010 | Lin | |
| 2010/0266288 A1 * | 10/2010 | Little | G02B 6/1228 398/139 |
| 2010/0301971 A1 * | 12/2010 | Yonak | H01P 7/082 333/219.1 |
| 2012/0152918 A1 | 6/2012 | Li | |
| 2013/0209033 A1 | 8/2013 | Luff | |
| 2014/0080729 A1 * | 3/2014 | Grego | G01N 33/54373 506/9 |
| 2014/0211298 A1 * | 7/2014 | Sayyah | G02F 1/29 359/298 |
| 2015/0023631 A1 * | 1/2015 | Shastri | G02B 6/46 385/14 |
| 2015/0042992 A1 | 2/2015 | Cui | |
| 2015/0062691 A1 * | 3/2015 | Sayyah | H01P 7/082 359/316 |
| 2015/0378011 A1 * | 12/2015 | Owechko | G01S 17/34 356/4.01 |
| 2015/0378012 A1 * | 12/2015 | Sayyah | G01S 17/34 356/4.01 |
| 2017/0153319 A1 | 6/2017 | Villeneuve | |
| 2017/0184450 A1 | 6/2017 | Doylend | |
| 2017/0336565 A1 | 11/2017 | Ryckman | |
| 2017/0370676 A1 | 12/2017 | Volfson | |
| 2018/0024299 A1 | 1/2018 | Leijtens | |
| 2018/0284780 A1 | 10/2018 | McWhirter et al. | |
| 2019/0018110 A1 * | 1/2019 | Kremer | G01S 7/4914 |
| 2019/0018112 A1 * | 1/2019 | Sayyah | G01S 7/499 |
| 2019/0018114 A1 | 1/2019 | Patterson et al. | |
| 2019/0018121 A1 * | 1/2019 | Sayyah | G01S 17/003 |

(56) References Cited

U.S. PATENT DOCUMENTS

2019/0018140 A1  1/2019 Sarkissian et al.
2020/0284883 A1* 9/2020 Ferreira ............... G01S 7/4816

OTHER PUBLICATIONS

Schroedter et al., "Microcontroller based closed-loop control of a 2D quasi-static/resonant microscanner with on-chip piezo-resistive sensor feedback", Proc. of SPIE, vol. 10116, 2017, pp. 1-12.
Winter et al., "Micro-beamer based on MEMS micro-mirrors and laser light source", Procedia Chemistry, vol. 1, Issue 1, 2009, pp. 1311-1314.

* cited by examiner

CHIP-SCALE LIDAR WITH A SINGLE 2D MEMS SCANNER

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to LIDAR (Light Detection and Ranging) systems and, in particular, to a LIDAR system formed on a chip.

LIDAR is a remote sensing method that uses light in the form of a pulsed or frequency or phase modulated laser to measure ranges and other parameters of selected objects. Increasingly, uses for LIDAR systems require reduced form factors and lighter weights, while still providing reliable measurements. Therefore, it is desirable to provide a LIDAR system that is lightweight and small.

SUMMARY

In one exemplary embodiment a LIDAR system is disclosed. The LIDAR system includes a photonic chip configured to transmit a transmitted light beam and to receive a reflected light beam, a scanner for directing the transmitted light beam towards a direction in space and receiving the reflected light beam from the selected direction, and a fiber-based optical coupler for directing the transmitted light from the photonic chip to the scanner and for directing the reflected light from the scanner to the photonic chip.

In addition to one or more of the features described herein, the fiber-based optical coupler further includes a fiber-based circulator and a fiber-based collimator. A first optical fiber provides optical communication of the transmitted light beam from the photonic chip to the fiber-based circulator and a second optical fiber provides optical communication of the reflected light beam from the fiber-based circulator to the photonic chip. The photonic chip further includes a transmitter beam edge or grating coupler aligned with the first optical fiber from transmitting the transmitted light beam to the fiber-based circulator and a receiver beam edge or grating coupler aligned with the second optical fiber for transmitting the reflected light beam to the photonic chip. The photonic chip and the scanner are disposed on a semiconductor integration platform and the fiber-based optical coupler is disposed on top of the photonic chip. The system further includes a processor configured to operate the photonic chip to generate the transmitted light and to receive data related to the reflected light in order to determine a parameter of an object that produces the reflected light via interaction with the transmitted light. In various embodiments, the light source is a distributed Bragg grating laser diode and the scanner is a two-dimensional microelectromechanical (MEMS) scanner.

In another exemplary embodiment, a method of manufacturing a LIDAR chip is disclosed. The method includes placing a photonic chip and a scanner on a semiconductor integrated platform (SIP), placing a fiber-based optical coupler on top of the photonic chip to optically couple to the photonic chip for directing the a transmitted light beam from the photonic chip to the scanner and for directing a reflected light beam from the scanner to the photonic chip.

In addition to one or more of the features described herein, the fiber-based optical coupler further includes a fiber-based circulator and a fiber-based collimator. The fiber-based optical coupler is placed on top of the photonic chip to optically couple the fiber-based circulator to the photonic chip via a first optical fiber and a second optical fiber. In particular, the fiber-based coupler is deposited on the photonic chip so that a transmitter beam edge or grating coupler of the photonic chip is aligned with the first optical fiber and a receiver beam edge or grating coupler of the photonic chip is aligned with the second optical fiber. The photonic chip is coupled to a processor by coupling the SIP to a printed circuit board including the processor. In various embodiments, the printed circuit board includes an analog-to-digital converter.

In yet another exemplary embodiment, a LIDAR chip is disclosed. The LIDAR chip includes a semiconductor integrated platform (SIP), a photonic chip coupled to a top surface of the SIP and configured to transmit a transmitted light beam and to receive a reflected light beam, a scanner coupled to the top surface of the SIP and configured to direct the transmitted light beam towards a selected direction in space and receiving the reflected light beam from the selected direction, and a fiber-based optical coupler deposited on top of the photonic chip for directing the transmitted light from the photonic chip to the scanner and for directing the reflected light from the scanner to the photonic chip.

In addition to one or more of the features described herein, the fiber-based optical coupler further includes a fiber-based circulator and a fiber-based collimator. A first optical fiber provides optical communication of the transmitted light beam from the photonic chip to the fiber-based circulator and a second optical fiber provides optical communication of the reflected light beam from the fiber-based circulator to the photonic chip. The photonic chip further includes a transmitter beam edge or grating coupler aligned with the first optical fiber from transmitting the transmitted light beam to the fiber-based circulator and a receive beam edge or grating coupler aligned with the second optical fiber for transmitting the reflected light beam to the photonic chip. The SIP is coupled to a printed circuit board including a processor. The processor is configured to provide a waveform to a light source associated with the photonic chip, receive data from a photodetector of the photonic chip and determine a parameter of an object from the data received from the photonic chip.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
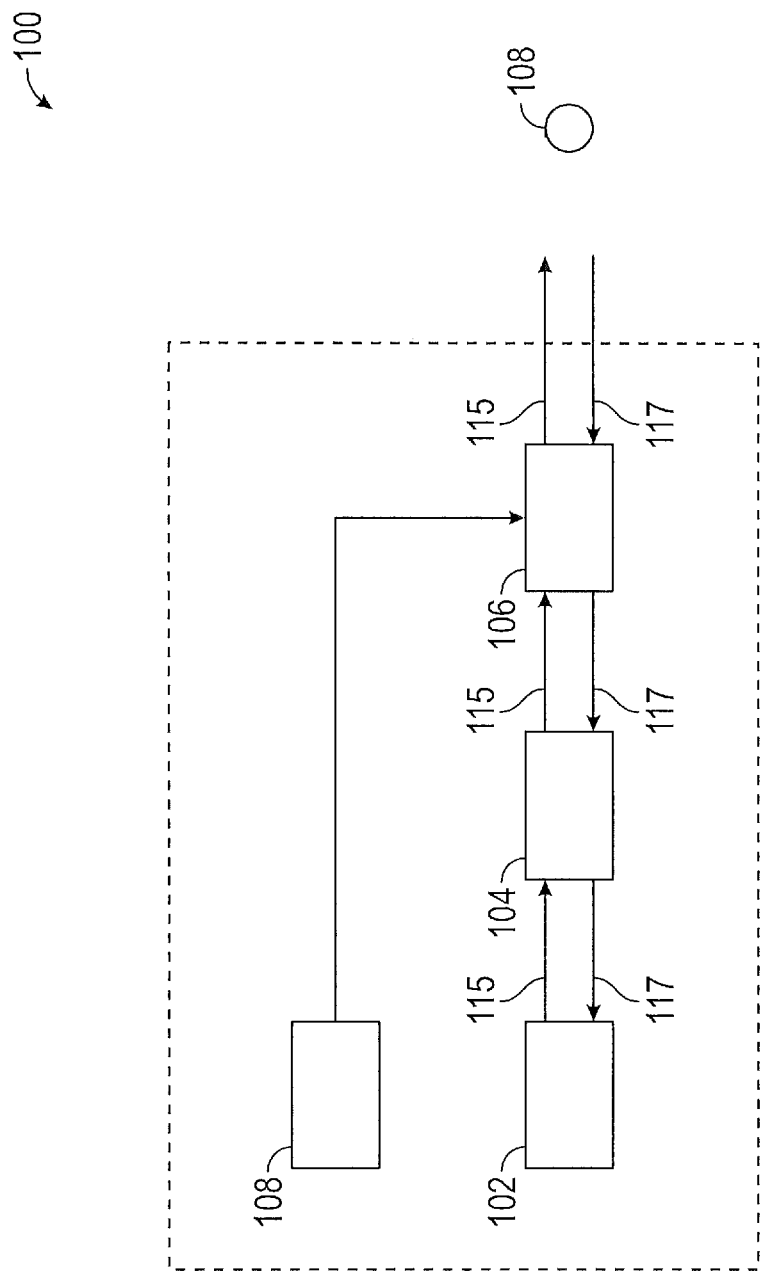
FIG. 1 shows a block diagram of a LIDAR system.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows a block diagram of a LIDAR system 100. The LIDAR system 100 includes a photonic chip 102, an optical coupler 104, and a microelectromechanical system (MEMS) scanner 106. A processor 108 controls operation of the photonic chip 102 in order to perform operations of the LIDAR system 100. In various embodiments, the LIDAR system 100 are disposed on a semiconductor integrated chip residing on a printed circuit board. As discussed in further detail with respect to FIG. 2, the photonic chip 102 includes a light source, such as a laser, an optical waveguiding network and a set of photodiodes. The laser generates a transmitted light beam 115 that is transmitted toward an object 110. Reflected light beam 117, which is due to interaction of the object 110 and the transmitted light beam 115, is optically mixed with a fraction (<10%) of the transmit beam in a set of photodiodes. The processor 108 controls the operation of the light source by controlling a waveform that modulates the light source. The processor 108 further receives data from the photodiodes and determines various parameters of an object 110 from the data.

In operation, the processor 108 controls the light source of the photonic chip 102 to generate a transmitted beam of light 115. The transmitted beam of light 115 passes through the optical coupler 104 which collimates the transmitted light beam 115 and directs the transmitted light beam 115 toward the MEMS scanner 106. The MEMS scanner 106 steers the transmitted light beam 115 over a range of angles into a surrounding region of the LIDAR system 100.

The MEMS scanner 106 includes a vibrating member such as a vibrating mirror. The processor 108 controls an oscillation of the vibrating member in order to steer the transmitted light beam 115 over a selected range of angles. In various embodiments, the MEMS scanner 106 is a two-dimensional (2D) MEMS, and the processor 108 controls oscillation of the vibration member in two angular direction, such as azimuth and elevation.

Reflected light beam 117 is formed when object 110 interacts with the transmitted light beam 115. A portion of the reflected light beam 117 is received at the MEMS scanner 106. The MEMS scanner 106 directs the reflected light beam 117 into the optical coupler 104 which redirects the reflected light beam 117 into the photonic chip 102.

In various embodiments, the LIDAR system 100 can be associated with a vehicle and the object 110 can be any object external to the vehicle, such as another vehicle, a pedestrian, a telephone pole, etc. The LIDAR system 100 determines parameters such as range, Doppler and azimuth and elevation of the object 110 and the vehicle uses these parameters to navigate with respect to the object 110 for the purposes of avoiding contact with the object 110.

Figure 2:
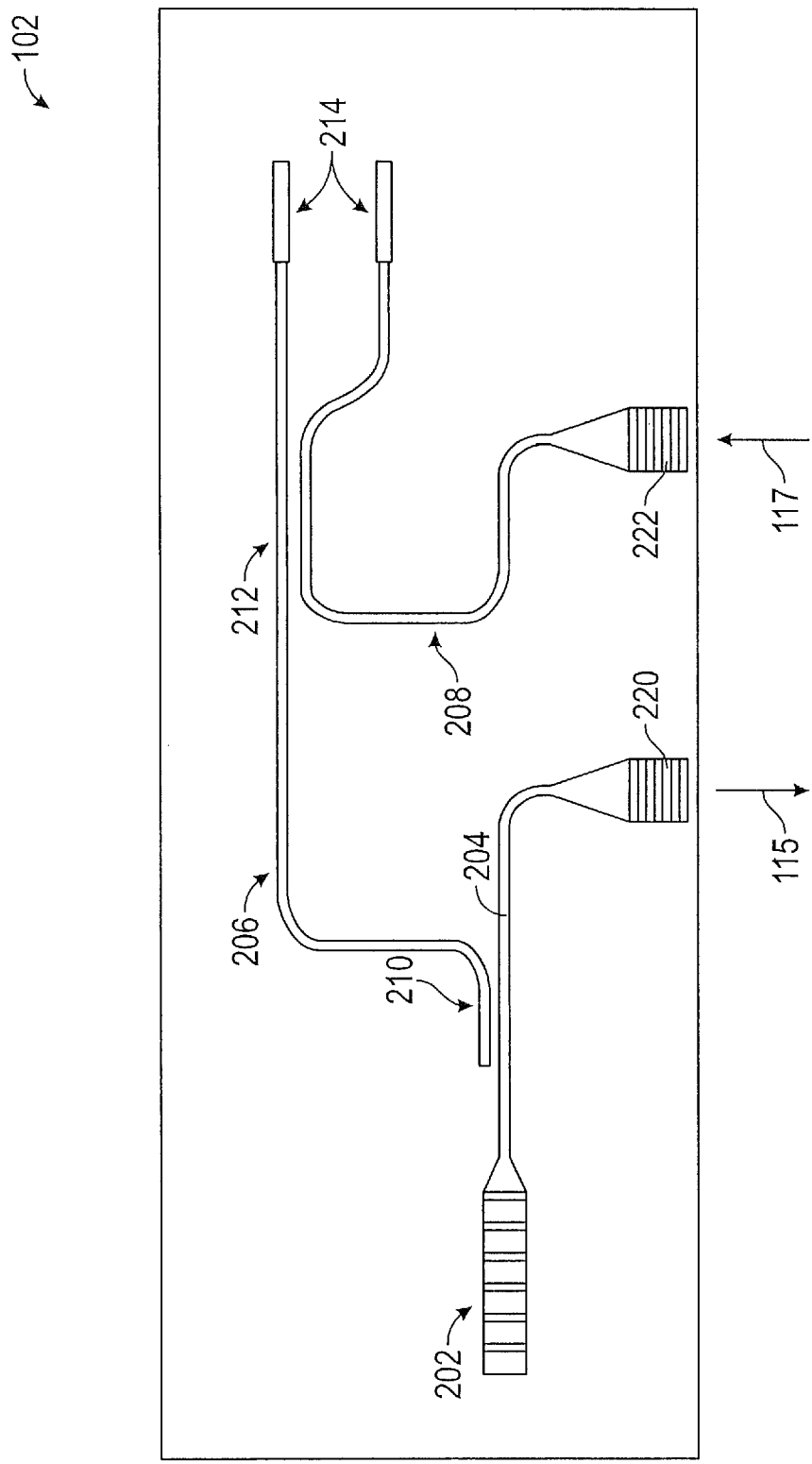
FIG. 2 shows an exemplary photonic chip suitable for use in the LIDAR system of FIG. 1.

FIG. 2 shows an exemplary photonic chip 102 suitable for use in the LIDAR system 100 of FIG. 1. In various embodiments, the photonic chip 102 is a scanning frequency modulated continuous wave (FMCW) LIDAR chip. The photonic chip 102 can be a silicon photonic chip in various embodiments. The photonic chip 102 receives light from a coherent light source such as a laser 202. The laser 202 can be independent from the photonic chip 102 or can be an integrated component of the photonic chip 102. The laser 202 can be any single frequency laser that can be frequency modulated. In an embodiment, the laser 202 is a distributed Bragg reflector (DBR) laser. In various embodiments, the laser 202 generates light at a frequency of 1550 nanometers (nm) or other wavelength considered safe to human eyes. The laser 202 is coupled to a transmitter waveguide 204 via an edge coupler that receives the light from the laser 202. The transmitter waveguide 204 directs the light from the laser 202 out of the photonic chip 102 via a transmitter beam edge or grating coupler 220 as transmitted light beam 115.

A local oscillator (LO) waveguide 206 is optically coupled to the transmitter waveguide 204 via a directional coupler/splitter or a multi-mode interference (MMI) coupler/splitter 210 located between the light source 202 and the edge or grating coupler 220. The directional or MMI coupler/splitter 210 splits the light from the laser 202 into a transmitted light beam 115 that continues to propagate in the transmitter waveguide 204 and a local oscillator beam that propagates in the local oscillator waveguide 206. In various embodiments, a splitting ratio can be 90% for the transmitter beam and 10% for the local oscillator beam. The local oscillator beam is directed toward a dual-balanced photodetector 214 that performs beam measurements.

Incoming or reflected light beam 117 enters the receiver waveguide 208 via a receiver beam edge or grating coupler 222. The receiver waveguide 208 directs the reflected light beam 117 from the receiver beam edge or grating coupler 222 to the dual-balanced photodetector 214. The receiver waveguide 208 is optically coupled to the local oscillator waveguide 206 at a directional or MMI coupler/combiner 212 located between the edge or grating coupler 222 and the photodetectors 214. The local oscillator beam and the reflected light beam 117 therefore interact with each other at the directional or MMI coupler/combiner 212 before being received at the dual-balanced photodetector 214. In various embodiments, the transmitter waveguide 204, local oscillator waveguide 206 and receiver waveguide 208 can be optical fibers.

The dual-balanced photodetector 214 detects frequency differences in the transmitted light beam 115 and the reflected light beam 117 due to reflection of the transmitter beam off of object 110, FIG. 1. The dual-balanced photodetector 214 is coupled to processor 108, FIG. 1. The processor 108, FIG. 1 determines from the frequency difference parameters of the object 110, such as range or distance, a direction of arrival of the object 110, and a velocity of the object 110 relative to the LIDAR system 100.

Figure 3A:
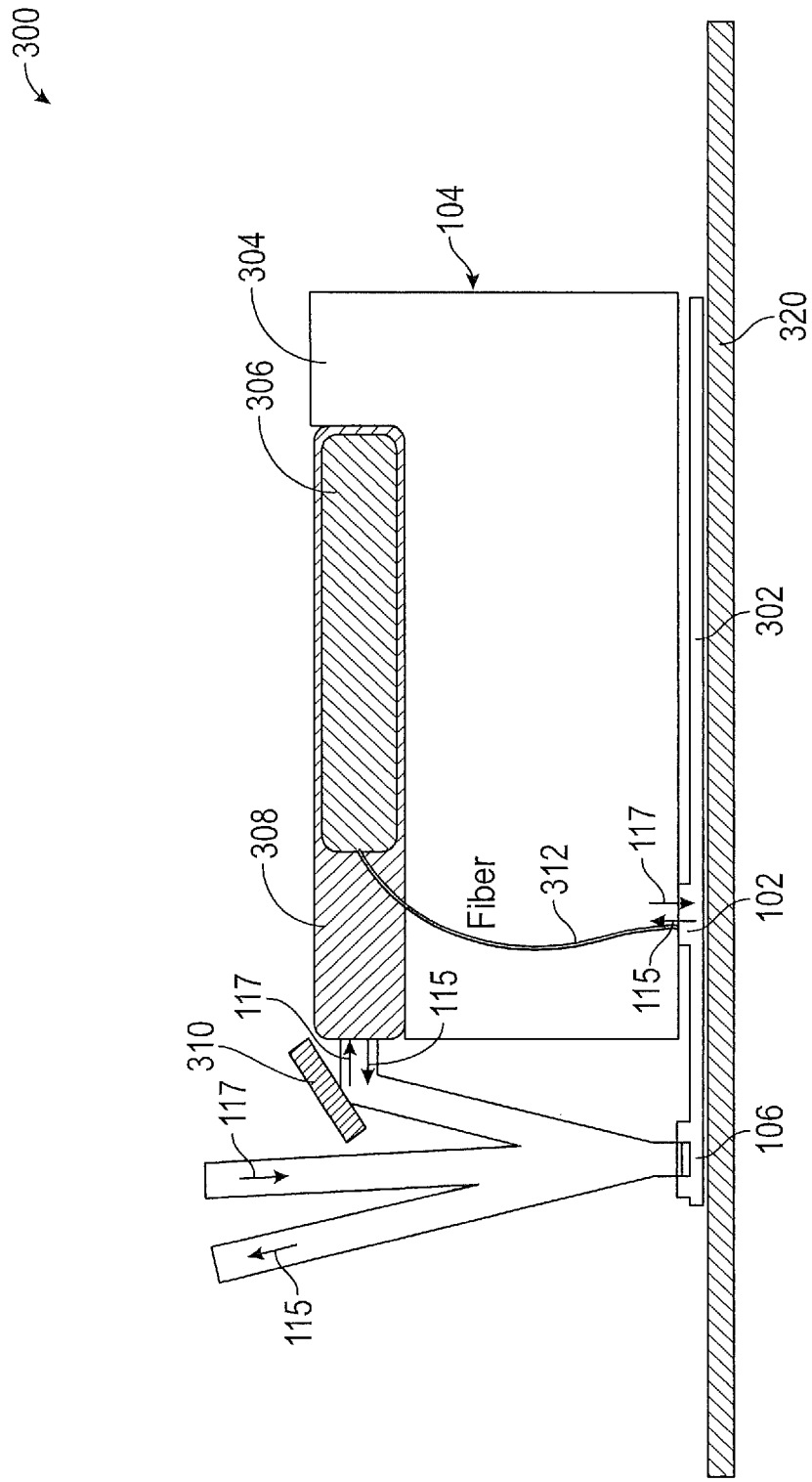
FIG. 3a shows a side view of an assembled LIDAR chip in an exemplary embodiment.

FIG. 3A shows a side view 300 of an assembled LIDAR chip in an exemplary embodiment. The assembled LIDAR chip includes the photonic chip 102, optical coupler 104 and the MEMS scanner 106. The photonic chip 102 and the MEMS scanner 106 are formed or placed on a top surface of a semiconductor integration platform (SIP) 302. The SIP 302 is affixed to a printed circuit board 320. The printed circuit board 320 can include an analog-digital converter and a digital signal processor, such as the processor 108 of FIG. 1, for driving the electronics of the photonic chip 102 and for post-processing of data from the photodetectors of the photonic chip 102. In various embodiments, the photonic chip 102 includes a laser 202, FIG. 2. The optical coupler 104 is placed on top of the photonic chip 102 so that the transmitter beam edge or grating coupler 220 and the receiver beam edge or grating coupler 222 are aligned with corresponding waveguides of the optical coupler 104. The optical coupler 104 includes a fiber-based circulator 306 and a fiber-based collimator 308 enclosed in and supported by a substrate 304, which can be a plastic substrate. Various optical fibers enclosed in the substrate 304 optically connect the circulator 306, collimator 308 and various inputs and outputs of the optical coupler 104. A representative optical fiber 312 illustrates an optical waveguide connecting the photonic chip 102 to the circulator 306. A more detailed view showing optical fiber connections between optical elements is shown in FIG. 3B.

Figure 3B:
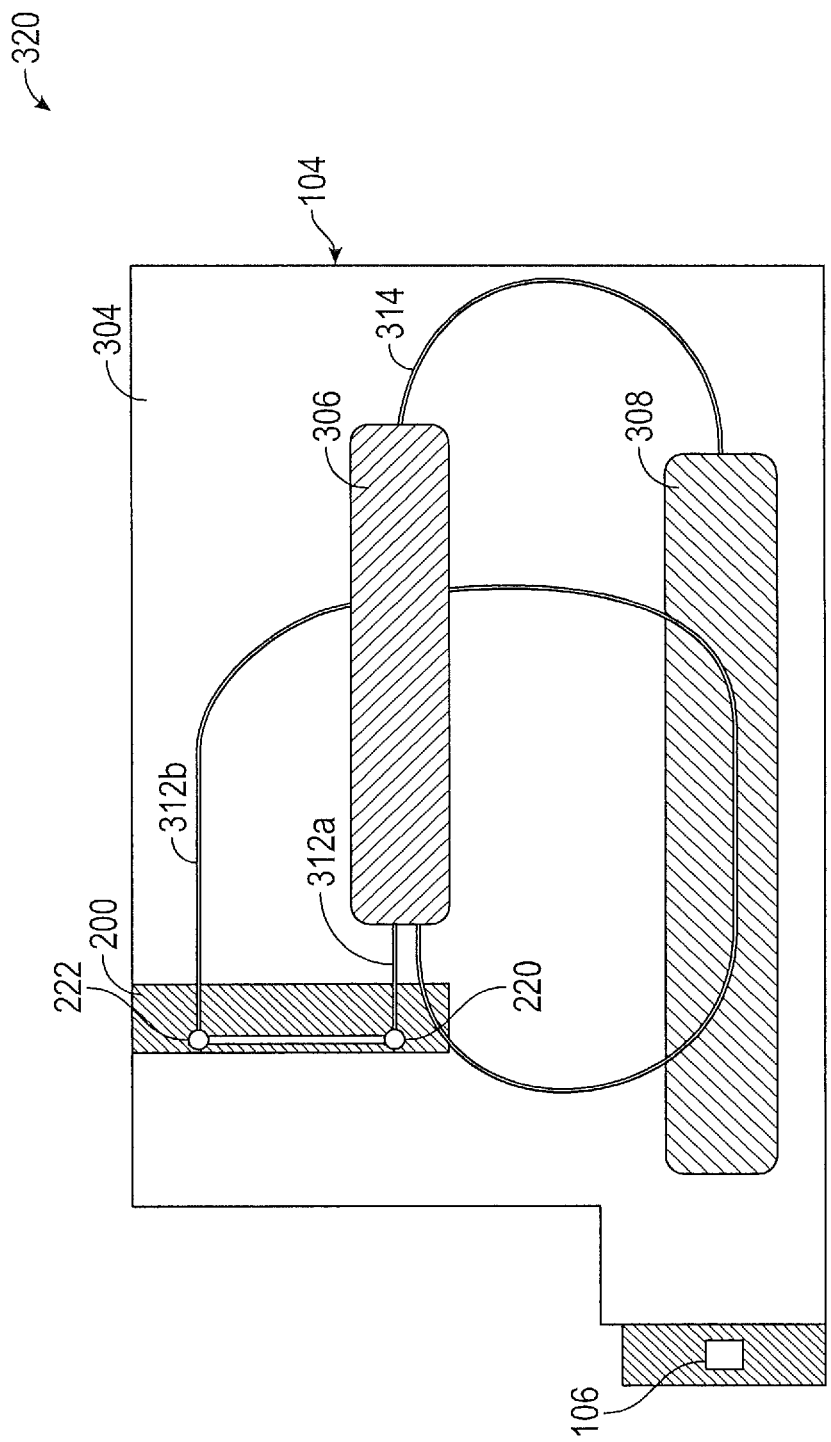
FIG. 3b shows a top view of the integrated LIDAR chip.

FIG. 3B shows a top view 320 of the integrated LIDAR system 100. The top view 320 shows details of the optical waveguides connecting the various optical elements of the optical coupler 104. In particular, optical fiber 312a provides an optical path from the transmitter beam edge or grating coupler 220 to the circulator 306. Optical fiber 312b provides an optical path from the circulator 306 to the receiver beam edge or grating coupler 222. Optical fiber 314 provides an optical path between the circulator 306 and the collimator 308.

The circulator 306 separates the optical paths of transmitted light beam 115 and the reflected light beam 117 so that the reflected light beam 117, which enters the circulator 306 along a selected optical path, is directed into the receiver beam edge or grating coupler 222 at a first location of the photonic chip 102 and the transmitted light beam 115, which exits the photonic chip 102 via the transmitted beam edge or grating coupler 220 at a second location, is directed along the same selected optical path.

Referring now to FIGS. 3A and 3B, a transmitted light beam 115 exiting the photonic chip 102 propagates sequentially through the circulator 306, the collimator 308 and out of the coupler 104 to impinge on a mirror 310 that reflects the transmitted light beam 115 onto the MEMS scanner 106. The MEMS scanner 106 directs the transmitted light beam 115 towards a selected direction in space based on the angular orientation of its vibrating member. The reflected light beam 117, traveling in the reverse direction of the transmitted light beam 115, impinges on the vibrating member of the MEMS scanner 106 and is reflected off of the MEMS scanner 106 onto the mirror 310 and into the collimator 308. The reflected light beam 117 then passes from the collimator 308 through the circulator 306 and into the photonic chip 102. Although transmitted light beam 115 and reflected light beam 117 are shown in FIG. 3A as having different optical paths, this is for illustrative purposes only. In various embodiments, the transmitted light beam 115 is directed to a selected direction in space and the reflected light beam 117 is received from the same selected direction in space. Therefore, the transmitted light beam 115 and reflected light beam 117 travel along the same optical path between the MEMS scanner 106 and the selected direction in space.

Figure 4:
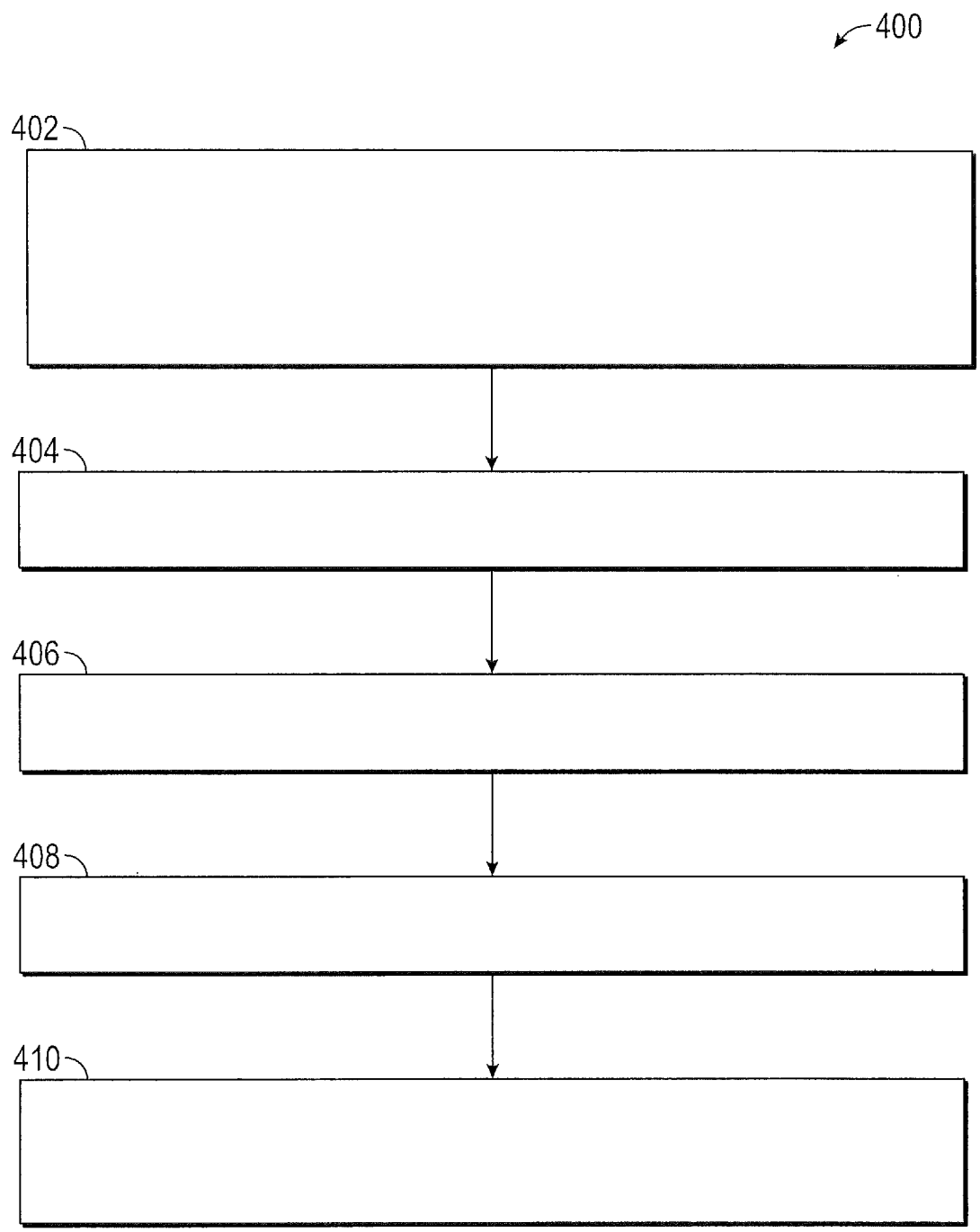
FIG. 4 shows a flowchart illustrating a method of producing a LIDAR photonic chip.

FIG. 4 shows a flowchart illustrating a method 400 of manufacturing the LIDAR photonic chip disclosed herein. In box 402, the photonic chip is fabricated. Fabrication of the photonic chip includes forming the various waveguides (i.e., transmitter beam waveguide 204, local oscillator waveguide 206 and receiver beam waveguide 208), directional or MMI couplers/splitters 210 and 212, and edge or grating couplers 220 and 222 within the photonic chip 102. In box 404, a laser is also integrated into the photonic chip. In box 406, the integrated photonic chip 102 and the MEMS scanner 106 are integrated onto a semiconductor integration platform (SIP) 302. In box 408, the fiber-based optical coupler 104 is placed on top of the photonic chip 102 in order to align the transmitted beam edge or grating coupler 220 optical fiber 312a of the optical coupler 104 and to align the receiver beam edge or grating coupler 222 with optical fiber 312b of the optical coupler 104. In box 410, the SIP 302 is integrated onto a printed circuit board 320.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A LIDAR system, comprising:
    a photonic chip configured to transmit a light beam and to receive a reflected light beam;
    a scanner for directing the transmitted light beam towards a direction in space and receiving the reflected light beam from the selected direction; and
    a fiber-based optical coupler for directing the transmitted light from the photonic chip to the scanner and for directing the reflected light from the scanner to the photonic chip, wherein the fiber-based optical coupler further comprises a fiber-based collimator for receiving the reflected light from the scanner.

2. The LIDAR system of claim 1, wherein the fiber-based optical coupler further comprises a fiber-based circulator and the reflected light from the fiber-based collimator passes through the fiber-based circulator.

3. The LIDAR system of claim 2, further comprising a first optical fiber for optical communication of the transmitted light beam from the photonic chip to the fiber-based circulator and a second optical fiber for optical communication of the reflected light beam from the fiber-based circulator to the photonic chip.

4. The LIDAR system of claim 3, wherein the photonic chip further comprises a transmitter beam edge or grating coupler aligned with the first optical fiber from transmitting the transmitted light beam to the fiber-based circulator and a receiver beam edge or grating coupler aligned with the second optical fiber for transmitting the reflected light beam to the photonic chip.

5. The LIDAR system of claim 3, wherein the light source is a distributed Bragg grating laser diode.

6. The LIDAR system of claim 1, wherein the photonic chip and the scanner are disposed on a semiconductor integration platform and the fiber-based optical coupler is disposed on top of the photonic chip.

7. The LIDAR system of claim 1, further comprising a processor configured to operate the photonic chip to generate the transmitted light and to receive data related to the reflected light in order to determine a parameter of an object that produces the reflected light via interaction with the transmitted light.

8. The LIDAR system of claim 1, wherein the scanner is a two-dimensional microelectromechanical (MEMS) scanner.

9. A method of manufacturing a LIDAR chip, comprising:
    placing a photonic chip and a scanner on a semiconductor integrated platform (SIP); and
    placing a fiber-based optical coupler on top of the photonic chip to optically couple to the photonic chip for directing a transmitted light beam from the photonic chip to the scanner and for directing a reflected light beam from the scanner to the photonic chip, wherein the fiber-based optical coupler includes a fiber-based collimator for receiving the reflected light from the scanner.

10. The method of claim 9, wherein the fiber-based optical coupler further comprises a fiber-based circulator and the reflected light from the fiber-based collimator fiber-based collimator passes through the fiber-based circulator.

11. The method of claim 10, further comprising placing the fiber-based optical coupler on top of the photonic chip to optically couple the fiber-based circulator to the photonic chip via a first optical fiber and a second optical fiber.

12. The method of claim 11, further comprising depositing the fiber-based coupler on the photonic chip so that a transmitter beam edge or grating coupler of the photonic chip is aligned with the first optical fiber and a receiver beam edge or grating coupler of the photonic chip is aligned with the second optical fiber.

13. The method of claim 9, further comprising coupling the photonic chip to a processor via coupling the SIP to a printed circuit board including the processor.

14. The method of claim 9, wherein the printed circuit board further comprises an analog-to-digital converter.

15. A LIDAR chip, comprising:
  a semiconductor integrated platform (SIP);
  a photonic chip coupled to a top surface of the SIP and configured to transmit a transmitted light beam and to receive a reflected light beam;
  a scanner coupled to the top surface of the SIP and configured to direct the transmitted light beam towards a selected direction in space and receive the reflected light beam from the selected direction; and
  a fiber-based optical coupler deposited on top of the photonic chip for directing the transmitted light from the photonic chip to the scanner and for directing the reflected light from the scanner to the photonic chip, wherein the fiber-based optical coupler further comprises a fiber-based collimator for receiving the reflected light from the scanner.

16. The LIDAR chip of claim 15, wherein the fiber-based optical coupler further comprises a fiber-based circulator and the reflected light from the fiber-based collimator passes through the fiber-based circulator.

17. The LIDAR chip of claim 16, further comprising a first optical fiber for optical communication of the transmitted light beam from the photonic chip to the fiber-based circulator and a second optical fiber for optical communication of the reflected light beam from the fiber-based circulator to the photonic chip.

18. The LIDAR chip of claim 17, wherein the photonic chip further comprises a transmitter beam edge or grating coupler aligned with the first optical fiber from transmitting the transmitted light beam to the circulator and a receive beam edge or grating coupler aligned with the second optical fiber for transmitting the reflected light beam to the photonic chip.

19. The LIDAR chip of claim 15, wherein the SIP is coupled to a printed circuit board including a processor.

20. The LIDAR chip of claim 19, wherein the processor is configured to provide a waveform to a light source associated with the photonic chip, receive data from a photodetector of the photonic chip and determine a parameter of an object from the data received from the photonic chip.

* * * * *